US 6,737,358 B2

United States Patent
He et al.

(10) Patent No.: US 6,737,358 B2
(45) Date of Patent: May 18, 2004

(54) PLASMA ETCHING UNIFORMITY CONTROL

(75) Inventors: Y. Long He, Campbell, CA (US); Albert Kwok, Fremont, CA (US); Tsukasa Abe, Santa Clara, CA (US); Han-Ming Wu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/076,129

(22) Filed: Feb. 13, 2002

(65) Prior Publication Data

US 2003/0153194 A1 Aug. 14, 2003

(51) Int. Cl.[7] ............................................. H01L 21/302
(52) U.S. Cl. .......................................... 438/714; 216/67
(58) Field of Search ........................ 216/67; 156/345.34, 156/345.35; 438/714

(56) References Cited

U.S. PATENT DOCUMENTS

| 4,578,559 | A | | 3/1986 | Hijikata et al. ........ 219/121 PE |
|---|---|---|---|---|
| 5,053,104 | A | | 10/1991 | Babu et al. ................... 156/643 |
| 5,843,847 | A | * | 12/1998 | Pu et al. ....................... 438/723 |
| 6,287,981 | B1 | | 9/2001 | Kim et al. .................... 438/729 |
| 6,290,806 | B1 | | 9/2001 | Donohoe ...................... 156/345 |
| 6,291,793 | B1 | | 9/2001 | Qian et al. ............... 219/121.43 |
| 6,436,812 | B1 | * | 8/2002 | Lee .............................. 438/636 |
| 2002/0132488 | A1 | * | 9/2002 | Nollan ......................... 438/720 |

FOREIGN PATENT DOCUMENTS

JP             61-171127          *  8/1986

OTHER PUBLICATIONS

"Implementation of Tungsten Metallization In Multilevel Interconnection Technologies"; IEEE Trans, on Semiconductor Mfg; vol. 3, No. 4; (Nov. 1990); Riley et al.; pp. 150–157.*

"X–Ray Mask Fabrication Technology for 0.1 $\mu$m Very Large Scale Integrated Circuits"; J. Vac Sci.; B; 14(6); (Dec. 1996); Oda et al.; pp. 4366–4370.*

* cited by examiner

Primary Examiner—George A. Goudreau
(74) Attorney, Agent, or Firm—Fish & Richardson P.C.

(57) ABSTRACT

Plasma etching is controlled utilizing two etchant gases to form a plasma so as to obtain controlled (e.g., uniform) etch rate across a wafer. One etchant gas forms a positive plasma, which is the dominant plasma. The other etchant gas forms a negative plasma, which is the secondary plasma. The ratio of dominant plasma to the secondary plasma can be adjusted such that ion densities are uniform across the wafer, resulting in uniform etch rate over the wafer.

35 Claims, 6 Drawing Sheets

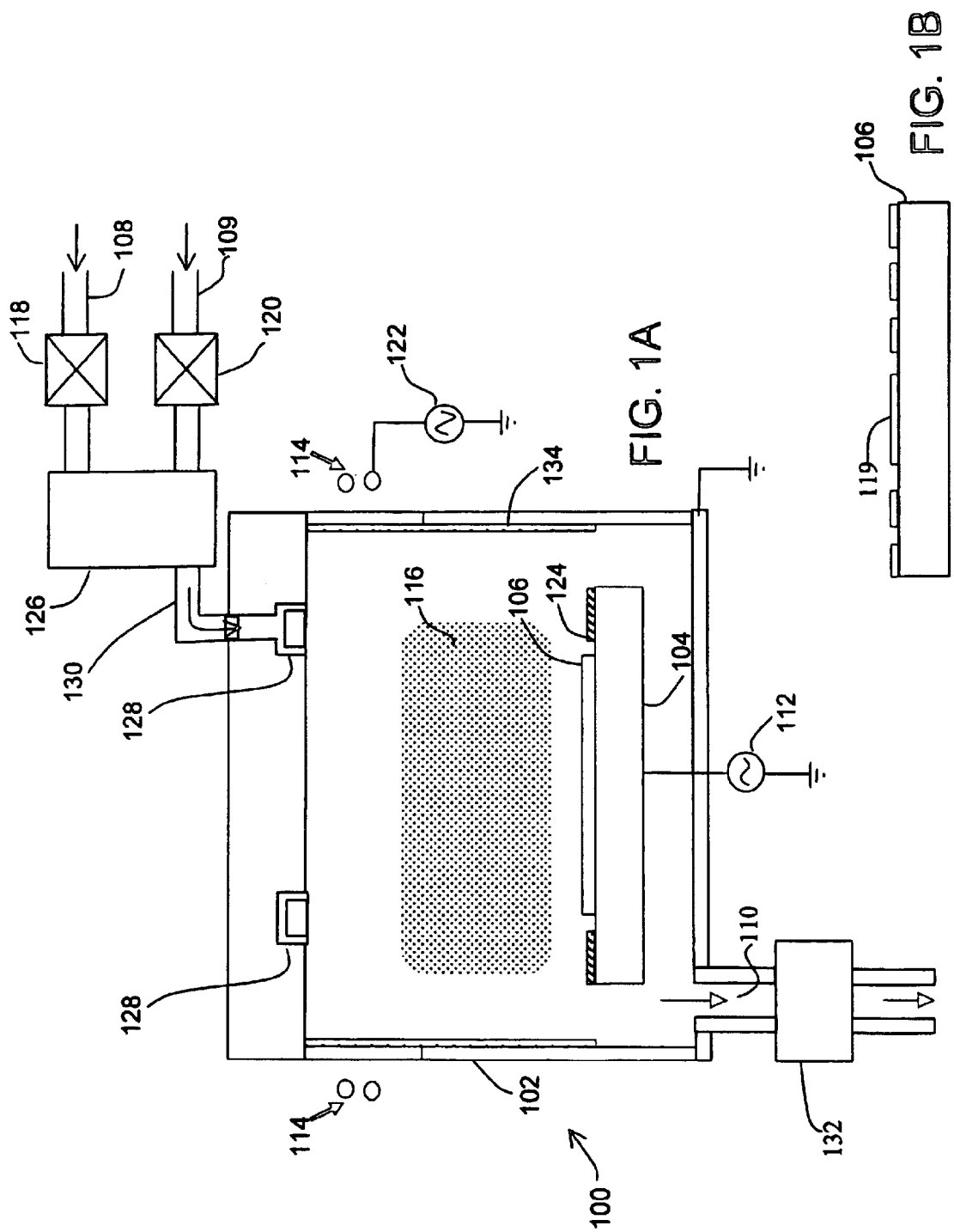

PLASMA ETCHING UNIFORMITY CONTROL

TECHNICAL FIELD

This invention relates to plasma etching uniformity control.

BACKGROUND

Plasma etching is used, e.g., in the fabrication of integrated circuits to produce high-resolution patterns in a semiconductor (e.g., silicon) wafer. The wafer is placed in a chamber in which electrons are accelerated by radio frequency (RF) or microwave electric fields. The electrons collide with other molecules to produce ions, neutral radicals, and more electrons. Between the plasma and the wafer surface layer, an electron-free space-charge region, called a "sheath", is formed, and ions are accelerated toward the wafer surface when entering the sheath. The accelerated ions bombard the wafer surface with high energies and chemically etch areas of the wafer that are exposed to the plasma. The areas exposed are in patterns defined by a resist placed on the wafer surface using lithographic methods.

In a typical plasma etching process, the etch rate near the center of the wafer is often greater than the etch rate in peripheral regions of the wafer, which can lead to uneven etch depths across the wafer. To alleviate this problem, wafers are sometimes provided with a stop layer at the desired etch depth. The stop layer is made of a material that is etched at a lower rate compared to the wafer surface material. As a result, when the central portions etch to the stop layer, etching can be continued until the peripheral regions etch to the stop layer.

DESCRIPTION OF DRAWINGS

FIG. 1A is a cross-sectional view of a plasma chamber.

FIG. 1B is a side view of a substrate.

Like reference symbols in the various drawings indicate like elements.

DETAILED DESCRIPTION

Figure 2A:
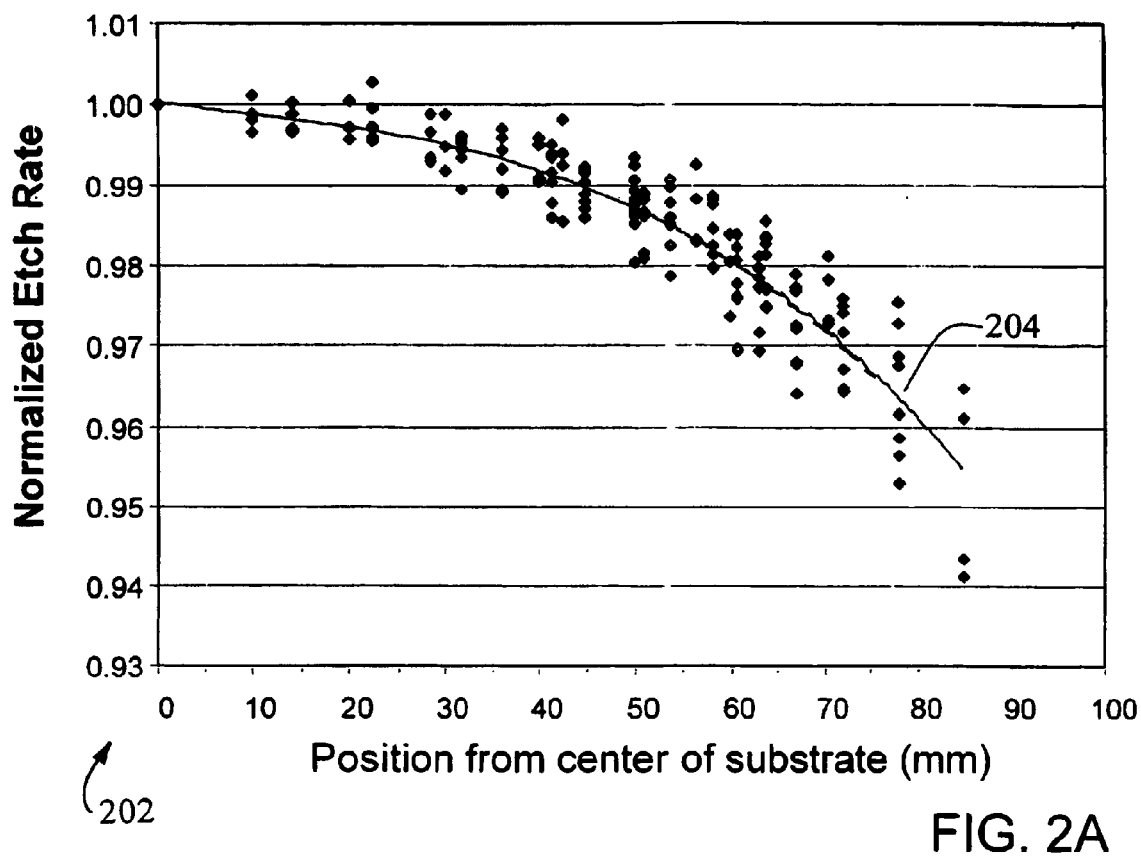
FIG. 2A is a graph of normalized etch rate as a function of position from substrate center.

As will be described in more detail below, a plasma is generated from a gas having first and second components, and is used to etch a substrate material. The relative etch rate at one location on the substrate material to the etch rate at another location on the substrate material is controlled by selecting the amount of the first and second components in the gas.

Referring to FIGS. 1A–1B, a system 100 for plasma etching includes a plasma reaction chamber 102 for generating a plasma 116 to etch a substrate 106 or material layers on substrate 106. Substrate 106 (patterned with a resist 119) may be, for example, a silicon wafer used to produce integrated circuits or a quartz substrate for use as a lithography mask to define optical patterns on a photo-resist. System 100 includes a lower electrode 104 connected to a first radio frequency (RF) power supply 112. Lower electrode 104 serves as a pedestal for supporting substrate 106 within chamber 102. A ring-shaped dielectric pad 124 is provided on top of lower electrode 104. Substrate 106 is placed on top of lower electrode 104 and surrounded by the ring-shaped dielectric pad 124. A second electrode 114 shaped as coils surrounding chamber 102 is connected to a second RF power supply 122. The wall of chamber 102 is connected to electric ground. Dielectric liners 134 are placed on the inner walls of chamber 102.

A first etchant gas is introduced into a mixing chamber 126 through an inlet 108. The amount of the first etchant gas flowing into chamber 126 is regulated by a first mass flow controller 118. A second etchant gas is introduced into chamber 126 through an inlet 109. The amount of the second etchant gas flowing into chamber 102 is regulated by a second mass flow controller 120. (Other gases, such as $O_2$, Ar, $N_2$, etc., typically in smaller amounts, may also be introduced into mixing chamber 126 through other inlets not shown in the figure.) The mixed gases flow from mixing chamber 126 to reaction chamber 102 through pipe 130 and gas distribution channel 128. Channel 128 is a ring-shaped groove in the upper wall of reaction chamber 102 that allows gas to distribute evenly into reaction chamber 102. A vacuum pump 132 is connected to an outlet 110 at the bottom of chamber 102 to regulate the pressure inside chamber 102.

To generate a plasma, RF power is provided to the chamber by RF power supplies 112 and 122. First RF power supply 112 has a frequency of about 13.56 MHz, and second RF power supply 114 has a frequency of about 2 MHz (frequencies allowed by FCC). A suitable plasma chamber apparatus is available as model VRL-ME-II-M-QTZ from Unaxis, St. Petersberg, Fla.

Referring to FIG. 2A, a graph 202 shows etch rates at different locations on substrate 106 when $CF_4$ gas is used as the plasma gas. The conditions are as follows: the substrate 106 is a quartz wafer substrate, chamber pressure P=22 mTorr, chamber temperature=72F., power of first RF power supply 112 is 150 watts, power of second RF power supply 122 is 300 watts, $CF_4$=60 sccm, and $N_2$=10 sccm. In graph 202, the black dots represent individual etch rates across the wafer at various distances measured from the center. Etch rate can be measured by using a Lasertec phase measurement tool, model MPM-400, available from Lasertec USA Inc., San Jose, Calif.

Trend line 204, produced by the least-squares curve fitting method, is provided. Trend line 204 shows that with $CF_4$ gas supplied to chamber 102, the etch rate at a peripheral portion of substrate 106 is lower than the etch rate at the center. As an example, the etch rate at a location 85 mm from the center is about 5% slower than the etch rate at the center. (Here, the results show variations of etch rate along radial directions from the center of wafer 102. It should be understood that the actual reference point is the center of lower plate 104, which is situated at the center of chamber 102. The center of substrate 106 is used as the reference point since it is aligned with the center of lower plate 104.)

Figure 3A:
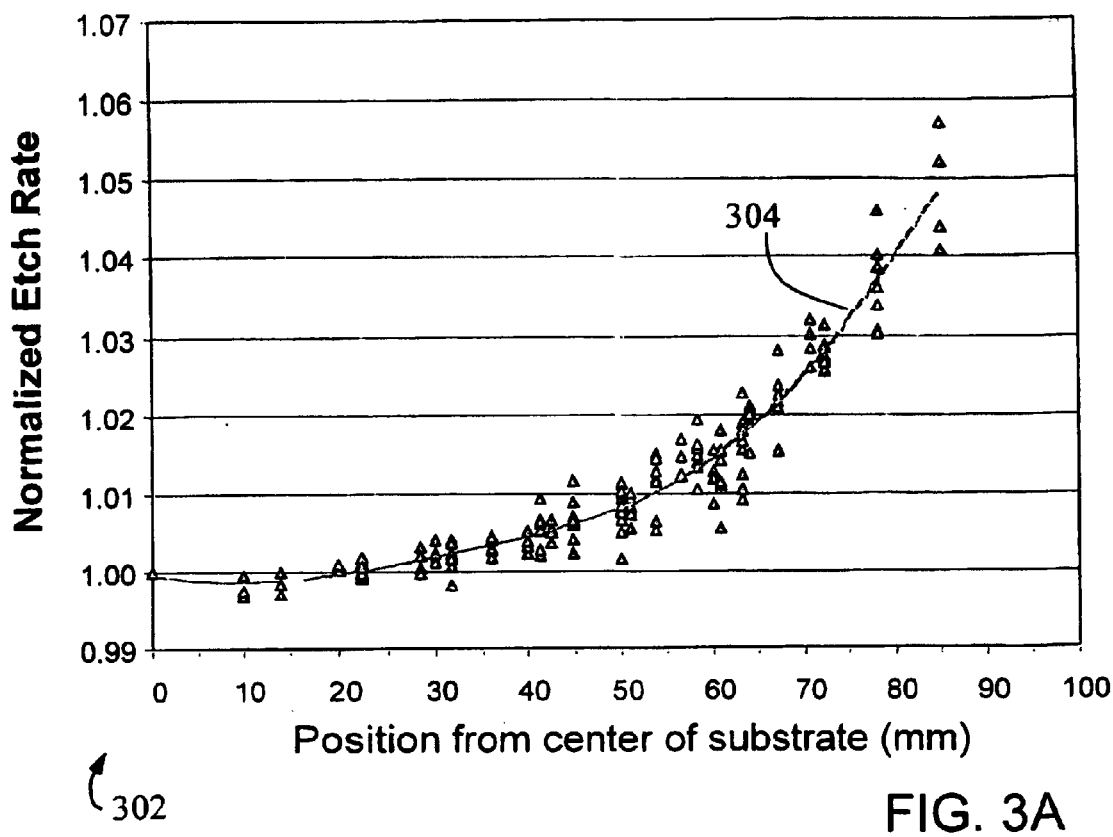
FIG. 3A is a graph of normalized etch rate as a function of position from substrate center.

Referring to FIG. 3A, a graph 302 shows etch rates for similar conditions as those of FIG. 2A, but with two components, $CF_4$ and $SF_6$ gas, added to chamber 102. The gas flow of $SF_6$ is 6 sccm. The volume ratio $CF_4$:$SF_6$ in this experiment is about 10:1. Because the amount of $CF_4$ gas is greater than the amount of $SF_6$ gas, the $CF_4$ plasma is referred to as the dominant plasma and the $SF_6$ plasma is referred to as the secondary plasma. A trend line 304 shows that the etch rate becomes higher for locations farther away from the center portion of substrate 106. As an example, the etch rate at a location 85 mm away from the center is about 5% higher than the etch rate at the center of substrate 106.

Figure 4:
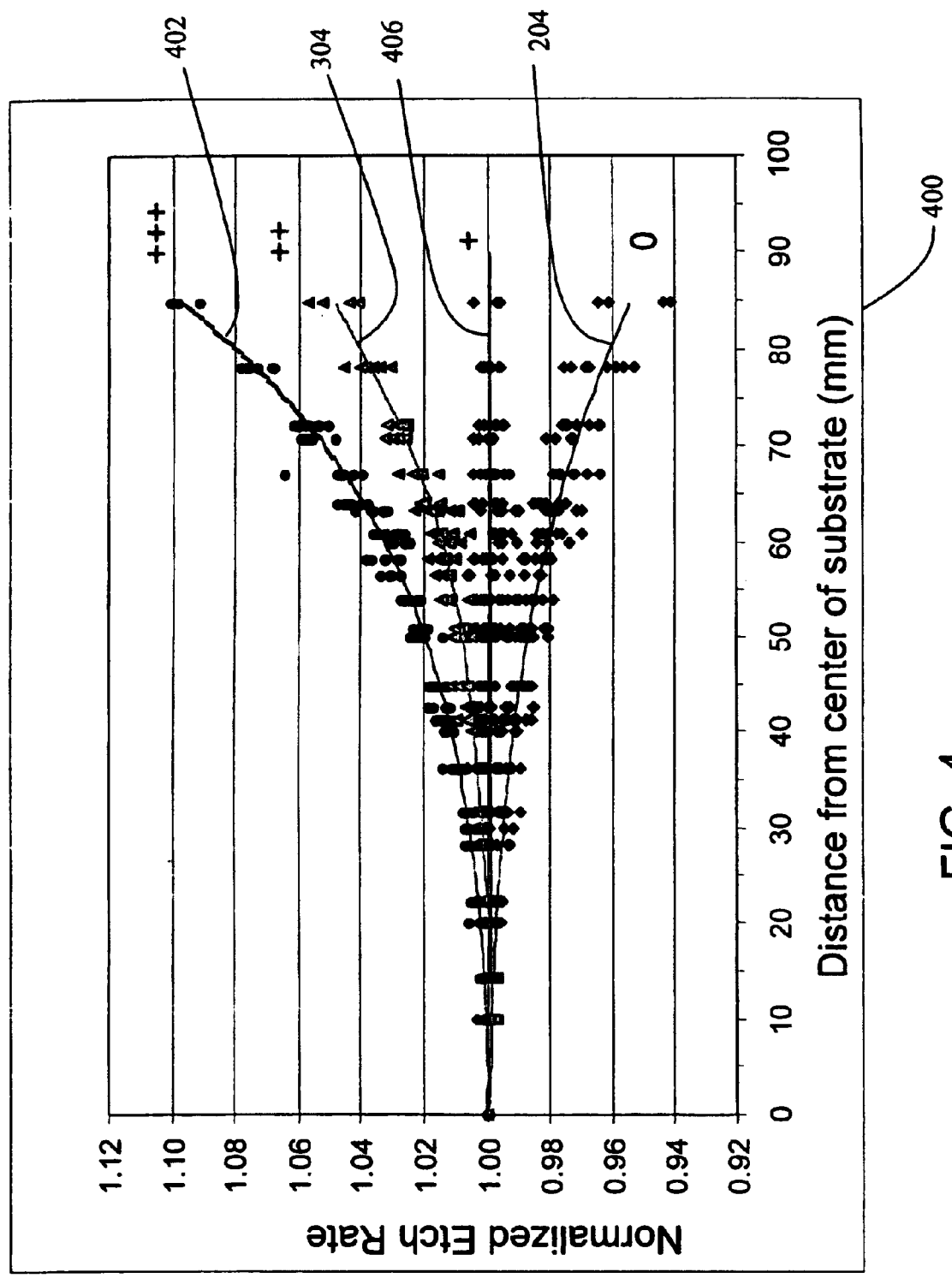
FIG. 4 is a graph of normalized etch rates as a function of position from substrate center for different etch conditions.

Referring to FIG. 4, a graph 400 shows the experimental results of etch rates when different amounts of $SF_6$ are added into chamber 102. A trend line 402 shows the etch rate distribution when $SF_6$ having a gas flow of 10 sccm is introduced into chamber 102. This corresponds to a volume ratio $CF_4$:$SF_6$=6:1. The trend line 304, as described above, shows the etch rate distribution when the gas flow of $SF_6$ is 6 sccm. A trend line 406 shows the etch rate distribution when $SF_6$ having a gas flow of 3 sccm is introduced into chamber 102. This corresponds to a volume ratio $CF_4$:$SF_6$= 20:1. The trend line 204, as described before, shows the etch rate distribution when no $SF_6$ is added to chamber 102.

The graph 400 shows that when no $SF_6$ is added, the etch rate at a peripheral portion is lower than the etch rate at the center of substrate 106, but as the amount of $SF_6$ relative to $CF_4$ increases, the etch rate at the peripheral portion increases. When a certain amount of $SF_6$ is added to chamber 102, the etch rate is substantially uniform across the wafer, regardless of the distance from the center. The accuracy of etch rate is within about 1% across the wafer. The ratio of CF4:$SF_6$ is about 20:1 when uniform etch rate is achieved. The rate of etching is about 30 nm/min. Introducing a higher percentage of $SF_6$ to chamber 102 results in a higher etch rate at a peripheral location than at the center.

The reactant gases which can be controlled to control etch rate include those that produce negative plasmas and those that produce positive plasmas. A gas produces a negative plasma when, under the pressure conditions of the chamber, it produces more negative ions than electrons. A gas produces a positive plasma when, under the pressure conditions of the chamber, it produces more electrons than negative ions.

An example of a gas that can produce a negative plasma is $SF_6$, which typically produces a negative plasma at chamber pressure of about 60 mTorr or less. When $SF_6$ is used as the etchant gas, electrons collide with $SF_6$ to form $SF_3^+$ and $SF_5^+$ other sulfuric-fluoride ions, radicals, and more electrons: $e+SF_6=>SF_3^++SF_5^++S_xF_y+e$ (x, y are an integer). An example of a gas that can produce a positive plasma is $CF_4$. When $CF_4$ is used as the etchant gas, electrons collide with $CF_4$ within chamber 102 to produce $CF_3^+$ ions, other carbon-fluoride ions, radicals, and more electrons: $e+CF_4=>CF_3^++C_xF_y+e$ (x, y are integers).

Figure 5B:
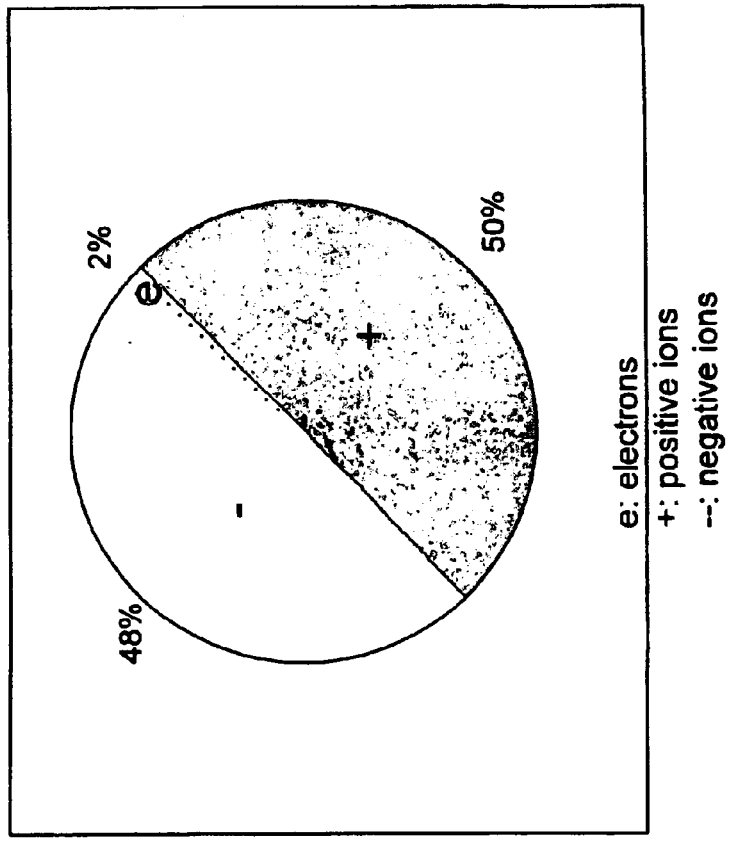
FIG. 5B is a graph of distribution of ions and electrons in $SF_6$ plasma.
Figure 5A:
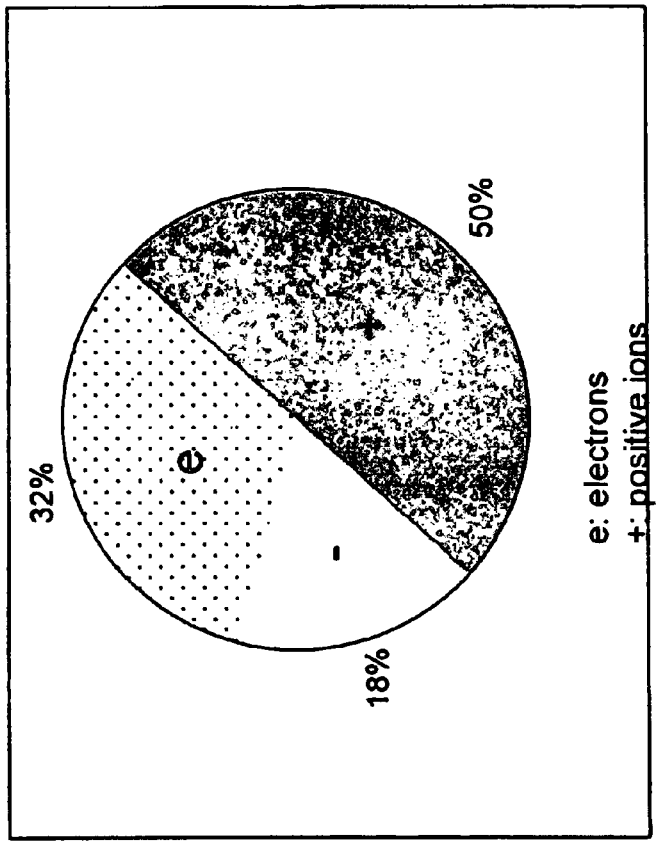
FIG. 5A is a graph of distribution of ions and electrons in $CF_4$ plasma.

Referring to FIGS. 5A and 5B, examples of the distributions of ions and electrons for $CF_4$ and $SF_6$ plasmas are illustrated. When $CF_4$ is energized into a plasma state, more electrons are generated than negative ions. Such plasma is referred to as a positive plasma. Referring to FIG. 5B, when $SF_6$ is energized into a plasma state, more negative ions are generated than electrons. Such plasma is referred to as a negative plasma. (The percentage numbers in the figure are used only for purpose of illustration.)

Other gases which can produce a positive plasma include other fluorocarbons, such as $C_2F_6$, $C_4F_8$, etc. Other gases which can produce negative plasmas include silicon fluoride and phosphorous fluoride. Oxygen can contribute to positive plasma at lower pressure but can be made more negative at a higher pressure. More than one type of gas may be used to contribute to either the positive plasma or negative plasma. Other facilitator gases, such as $N_2$, Ar, and $O_2$ can be added to aid the processing. For example, $O_2$ is believed to etch by-product (polymer) clean so that surfaces will not be covered to stop etching. Argon is for the same consideration, but Argon works through physical bombardment, while $O_2$ through chemical reaction. $N_2$ is used to improve selectivity and to reduce residence time of materials which need to be pumped out.

For different dominant and secondary plasmas at normal operating conditions, or a different chamber pressure, or a different power for the radio frequency power supply, the etch rate distributions are different. By selecting an appropriate amount of negative plasma and positive plasma, a desired etch rate distribution can be achieved, such as an etch rate that is substantially uniform across the wafer.

It is believed that the differences in the ratios of negative ions to electrons account for differences in spatial distributions for $CF_3^+$, $SF_3^+$, and $SF_5^+$ ions within chamber 102, which affect the rate of etching across the wafer.

Figure 2B:
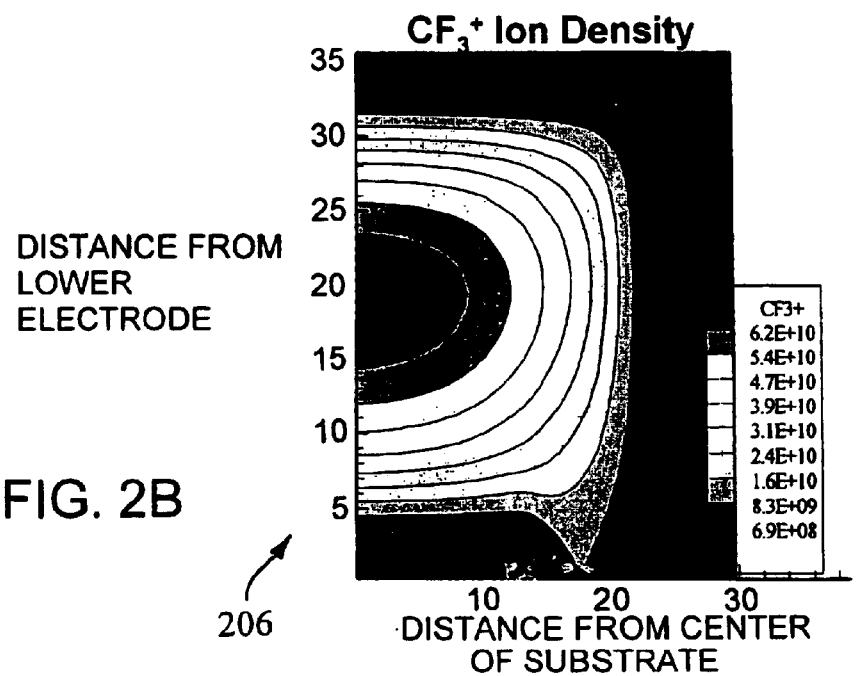
FIG. 2B is a graph of $CF_3^+$ ion density as a function of distance from substrate center for one etch condition.
Figure 3B:
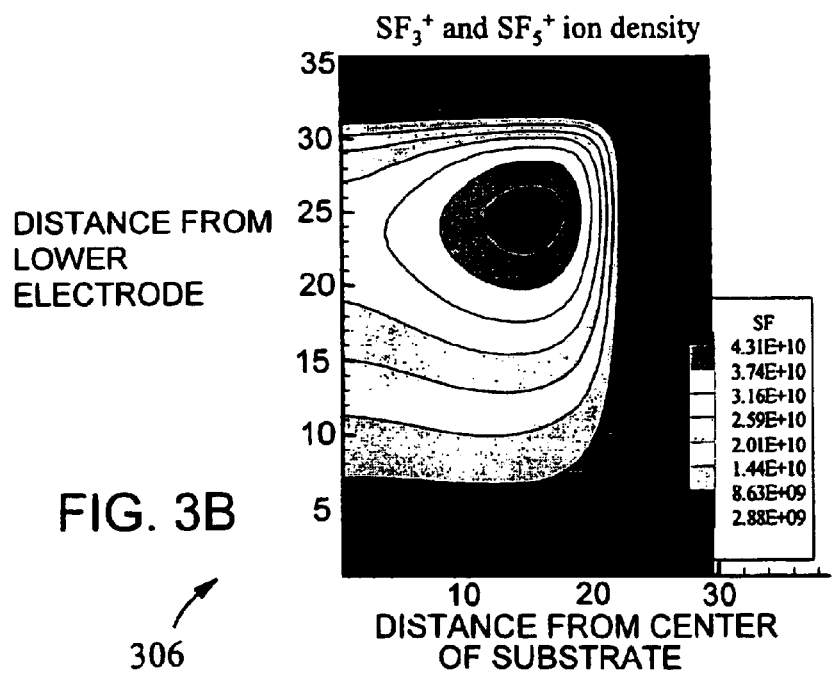
FIG. 3B is a graph of $SF_3^+$ and $SF_5^+$ ion density as a function of distance from substrate center for one etch condition.

Referring to FIGS. 2B and 3B, ion distribution simulations are provided under conditions similar to the experimental conditions of FIGS. 2A and 3A, respectively. The simulations were generated using PLASMATOR software, available through Lawrence Livermore National Laboratories and Kinema Research & Software, Monument, Colo. In the simulations, $CF_4$ and $SF_6$ gases are simulated under conditions similar to operating processes. The $CF_3^+$ ion is the dominant species of etching in the $CF_4$ plasma, and $SF_3^+$ and $SF_5^+$ ions are the dominant species of etching in the $SF_6$ plasma.

Referring to FIG. 2B, a graph 206 shows a simulation of $CF_3^+$ ion distribution within chamber 102 when only $CF_4$ is used as the process gas. The center portion of chamber 102 has a higher concentration of $CF_3^+$ ions than the peripheral portions of chamber 102. The higher concentration of positive ions results in a higher etching rate at the center portion of substrate 106 relative to the peripheral portions.

Referring to FIG. 3B, a graph 306 shows a simulation of $SF_3^+$ and $SF_5^+$ ion distribution within chamber 102 when only $SF_6$ is used as the process gas. The $SF_3^+$ and $SF_5^+$ ions have higher concentrations at a peripheral portion of chamber 102 than at the center portion. The higher concentration of positive ions at the peripheral portion results in a higher etching rate at the peripheral portion of substrate 106 relative to the center.

Figure 6:
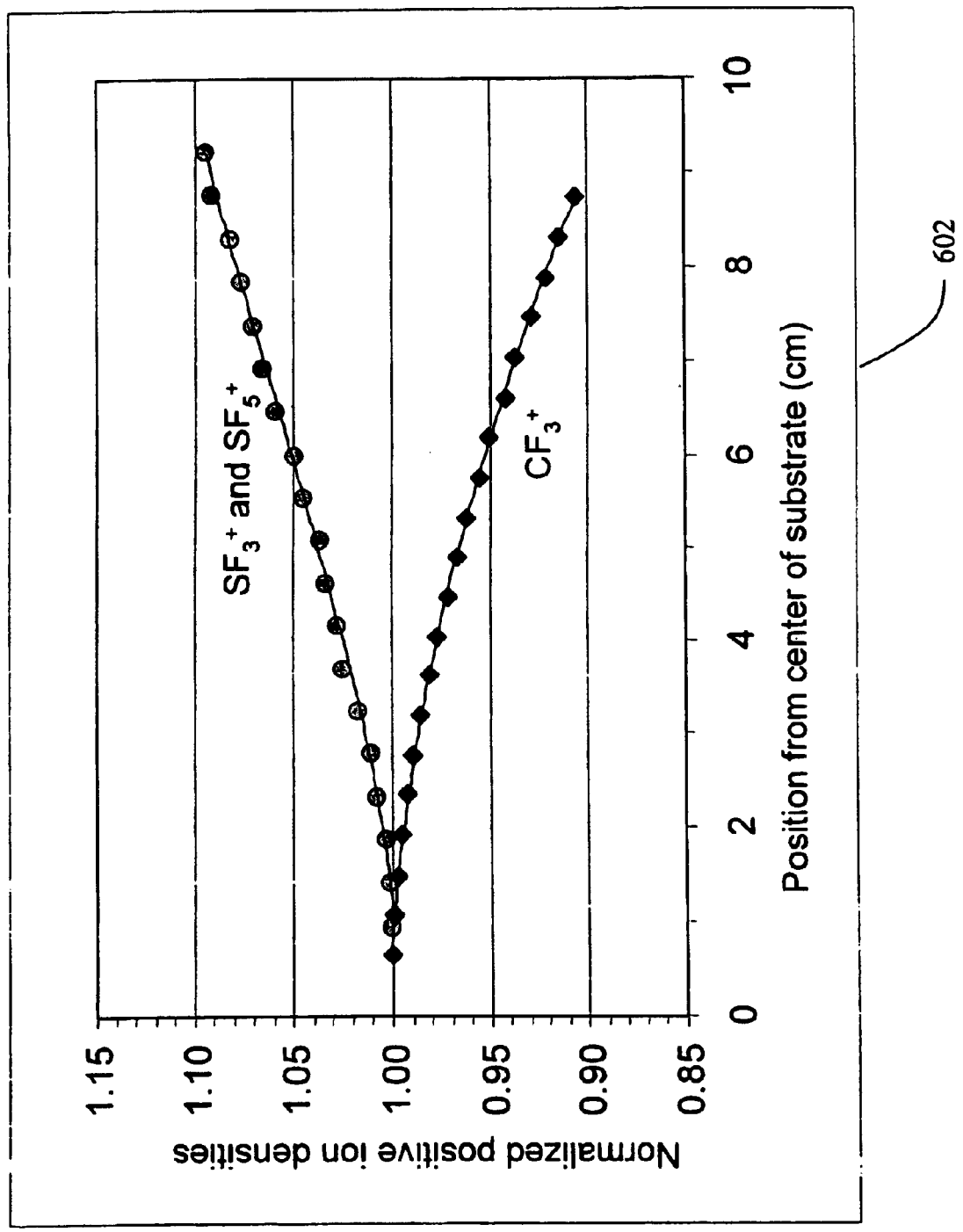
FIG. 6 is a graph of normalized ion density as a function of position from substrate center.

Referring to FIG. 6, a graph 602 shows simulation results of $SF_3^+$, $SF_5^+$, and $CF_3^+$ ion density distributions along a radial direction from the wafer center, where the process conditions are identical as in FIGS. 2B and 3B, respectively. Because the densities of $SF_3^+$ and $SF_5^+$ ions increase at locations farther away from the center, whereas the density of $CF_3^+$ ions decreases at locations farther away from the center, when $SF_6$ and $CF_4$ are both used as process gases, the two types of ions complement each other and result in an even distribution of ion densities across the wafer. Such uniform distribution of positive ion densities result in a uniform etch rate across the wafer.

An advantage is that uniform etch depths across a wafer substrate can be obtained, even without the use of a stop layer (although a stop layer may be used as well). As a result, wafer processing may be simplified and the etching time may be reduced. The process can also be used to etch other substrates. An example is a quartz lithography mask, which is illuminated to generate a lithographic interference pattern. The mask carries pits which are of uniform depth to maintain the accuracy of the out-of-phase interference relationship between light waves passing through the etched portions and light waves passing through the un-etched portions. Since the quartz substrate itself is being etched, a stop layer is not used inside the quartz substrate to prevent non-uniform etch depth. In addition to uniform depths across a substrate, carefully controlled non-uniform depths can be achieved when desired.

Controlling the relative amounts of two types of plasma in a chamber to control uniformity of etch rates across a substrate can be applied in different operation conditions where etch rates are different. For example, the method described can be used in silicon processes that need high etch rate to obtain high throughput. The method can also be used in photolithographic mask processes where lower etch rates are preferred to simplify tool cooling systems.

Other embodiments are within the following claims.

What is claimed is:

1. A method, comprising:
   providing a substrate material comprising a quartz plate;
   providing a gas for generating a plasma, the gas including a first component and a second component selected such that varying the ratio of the first component to the second component varies the rate of etching of one location of the substrate relative to another location on the substrate;
   generating the plasma; and
   using the plasma to etch the substrate material.

2. The method of claim 1, further comprising controlling the rate of etching at a peripheral portion and a central portion of the substrate material by selecting the amount of said first component and second component in the gas.

3. The method of claim 2, wherein the rate of etching near the peripheral portion is substantially equal to the rate of etching near the central portion.

4. The method of claim 1, wherein said first and second components are selected to generate different ratios of negative ions to electrons within the plasma.

5. The method of claim 1, wherein said first component comprises molecules $C_xF_y$, x and y being integers.

6. The method of claim 1 or 5, wherein said second component comprises at least one of silicon fluoride, phosphorous fluoride, and sulfur fluoride.

7. The method of claim 1, wherein the first component comprises molecules $C_xF_y$, x and y being integers, and the second component comprises $SF_6$.

8. The method of claim 7, wherein the first component comprises $CF_4$.

9. The method of claim 1, wherein the volume ratio of the first component to the second component is between about 100:1 to 5:1.

10. The method of claim 1, wherein the volume ratio of the first component to the second component is between about 50:1 to 10:1.

11. The method of claim 1, wherein the volume ratio of the first component to the second component is between about 25:1 to 15:1.

12. The method of claim 1, wherein the plasma is sustained by an electromagnetic field having a frequency of about 13 megahertz.

13. The method of claim 1, further comprising sustaining the plasma by a first electromagnetic field and a second electromagnetic field, the first electromagnetic field having a frequency of about 13 megahertz, the second electromagnetic field having a frequency of about 2 megahertz.

14. The method of claim 1, wherein the substrate material comprises a semiconductor wafer.

15. The method of claim 2, further comprising controlling the rate of etching at the peripheral portion to be within about 1% of the rate of etching at the central portion, the peripheral portion being at least about 50mm from the central portion.

16. The method of claim 1, wherein the first component is carbon tetrafluoride, the second component is sulfur hexafluoride, the volume ratio of (first component):(second component) is about 40:1, and the method further comprising sustaining the plasma by using a first electromagnetic field and a second electromagnetic field, the first electromagnetic field having a frequency of about 13 megahertz and the second electromagnetic field having a frequency of about 2 megahertz.

17. A method, comprising:
    providing a substrate material comprising a quartz plate,
    providing a gas for generating a plasma, the gas including a first component comprising molecules $C_xF_y$, x and y being integers, and a second component comprising at least one of silicon fluoride, phosphorous fluoride, and sulfur fluoride;
    generating the plasma; and
    etching the substrate material.

18. The method of claim 17 wherein the first component comprises $CF_4$ and the second component comprises $SF_6$.

19. The method of claim 17 or 18 wherein the volume ratio of the first component to the second component is about 20:1.

20. A method, comprising:
    providing a gas for generating a plasma in a chamber, the gas including a first component and a second component, wherein the first component produces a positive plasma and the second component produces a negative plasma, the positive plasma having more electrons than negative ions, the negative plasma having more negative ions than electrons;
    generating the plasma; and
    controlling the ion distribution within the chamber by selecting the amount of the first component and the second component.

21. The method of claim 20 wherein the first component comprises molecules $CF_xF_y$, x and y being integers, and the second component comprises at least one of sulfur fluoride, silicon fluoride, and phosphorus fluoride.

22. The method of claim 20 wherein the first component comprises $CF_4$ and the second component comprises $SF_6$.

23. The method of claim 17, further comprising adjusting a ratio of the first component to the second component such that the plasma etches the substrate material at a substantially uniform rate across a substantial portion of the substrate material.

24. The method of claim 20, wherein controlling the ion distribution comprises controlling the distribution of a first group of positive ions generated from the first component such that the density of the first group of positive ions decreases radially from a central region of the chamber towards a peripheral region of the chamber.

25. The method of claim 24, wherein controlling the ion distribution comprises controlling the distribution of a second group of positive ions generated from the second component such that the density of the second group of positive ions increases radially from a central region of the chamber towards a peripheral region of the chamber.

26. The method of claim 25, further comprising providing a substrate in the chamber and controlling the distribution of first and second groups of positive ions such that the density of the sum of the first and second groups of positive ions is substantially uniform across a substantial portion of the substrate.

27. A method, comprising:
providing a substrate comprising a quartz plate, portions of the substrate being covered by a resist;
providing a gas to generate a plasma, the gas including a first component and a second component selected such that varying the ratio of the first component to the second component varies the rate of etching of one location of the substrate relative to another location on the substrate, the first and second components selected such that the plasma etches the substrate at a rate that is faster than a rate that the plasma etches the resist;
generating the plasma;
using the plasma to etch portions of the substrate not covered by the resist; and
supplying the gas with the first and second components at a ratio such that the plasma etches portions of the substrate not covered by the resist at a substantially uniform rate across a substantial portion of the substrate.

28. A method, comprising:
providing a substrate in a chamber, the substrate comprising a quartz plate;
providing a first gas including carbon fluoride $C_{x1}F_{y1}$, x1 and y1 being integers;
providing a second gas including molecules comprising at least one of sulfur fluoride $S_{x2}F_{y2}$, phosphorous fluoride $P_{x3}F_{y3}$, and silicon fluoride $Si_{x4}F_{y4}$, x2, x3, x4, y2, y3, and y4 being integers;
supplying an electromagnetic field at a predetermined power level to energize the first and second gases into a plasma; and
adjusting a ratio of the first gas to the second gas so that the plasma etches the substrate material at a substantially uniform rate across a substantial portion of the substrate.

29. The method of claim 28, further comprising adjusting a pressure of a chamber enclosing the substrate and the plasma to a predetermined pressure level.

30. A method comprising:
providing a substrate in a chamber;
providing a first gas selected so that when the first gas is energized by an electromagnetic field having a predetermined power and under a predetermined chamber pressure, the first gas is energized into a plasma having more negative ions than electrons;
providing a second gas selected so that when the second gas is energized by an electromagnetic field having the predetermined power level and under the predetermined chamber pressure level, the second gas is energized into a plasma having more electrons than negative ions;
applying an electromagnetic field to the first and second gases to generate a plasma; and
adjusting the amount of the first gas and the second gas in the chamber so that the density of positive ions generated from the first and second gases near the surface of the substrate is substantially uniform across a substantial portion of the substrate.

31. The method of claim 30, further comprising using the plasma to etch the substrate.

32. The method of claim 30, wherein the first gas is also selected so that when the first gas is energized into a plasma by an electromagnetic field having the predetermined power and under the predetermined chamber pressure, positive ions generated from the first gas has a density distribution that increases radially from a central region of the substrate surface towards a peripheral region of the substrate surface.

33. The method of claim 32, wherein the second gas is also selected so that when the second gas is energized into a plasma by an electromagnetic field having the predetermined power and under the predetermined chamber pressure, positive ions generated from the second gas has a density distribution that decreases radially from a central region of the substrate surface towards a peripheral region of the substrate surface.

34. The method of claim 30, wherein the volume ratio of the first gas to the second gas is between 1:10 to 1:100.

35. The method of claim 30, wherein the substrate comprises quartz.

* * * * *